United States Patent
Lee et al.

(10) Patent No.: US 8,754,717 B2
(45) Date of Patent: Jun. 17, 2014

(54) OSCILLATORS AND METHODS OF OPERATING THE SAME

(75) Inventors: Sung-chul Lee, Osan-si (KR); Sun-ae Seo, Hwaseong-si (KR); Un-hwan Pi, Seoul (KR); Kee-won Kim, Suwon-si (KR); Kwang-seok Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 36 days.

(21) Appl. No.: 13/096,627

(22) Filed: Apr. 28, 2011

(65) Prior Publication Data
US 2012/0056685 A1    Mar. 8, 2012

(30) Foreign Application Priority Data

Sep. 2, 2010  (KR) ........................ 10-2010-0086182

(51) Int. Cl.
*H03B 15/00*    (2006.01)
*B82Y 25/00*    (2011.01)

(52) U.S. Cl.
CPC .............. *H03B 15/006* (2013.01); *B82Y 25/00* (2013.01)
USPC ....... 331/96; 331/94.1; 331/187; 360/324.12; 360/324.11

(58) Field of Classification Search
CPC .................................................... H03B 15/006
USPC ............. 331/108 C, 154, 94.1, 86, 96, 107 R, 331/107 T; 360/324.12, 324.11, 324.1
See application file for complete search history.

(56) References Cited

U.S. PATENT DOCUMENTS

| | | |
|---|---|---|
| 6,560,077 B2 | 5/2003 | Fujiwara et al. |
| 7,054,119 B2 | 5/2006 | Sharma et al. |
| 7,057,921 B2 | 6/2006 | Valet |
| 7,088,609 B2 | 8/2006 | Valet |
| 7,161,829 B2 | 1/2007 | Huai et al. |
| 7,440,314 B2 | 10/2008 | Sakimura et al. |
| 7,466,526 B2 | 12/2008 | Sato et al. |
| 7,504,898 B2 | 3/2009 | Fukuzawa et al. |
| 7,589,600 B2 | 9/2009 | Dimitrov et al. |

(Continued)

FOREIGN PATENT DOCUMENTS

| | | |
|---|---|---|
| JP | 2006-319259 | 11/2006 |
| JP | 2007-305629 | 11/2007 |

(Continued)

OTHER PUBLICATIONS

Kent, "A nanomagnet oscillator", nature materials, vol. 6, Jun. 2007, pp. 399-400.*

(Continued)

*Primary Examiner* — Ryan Johnson
(74) *Attorney, Agent, or Firm* — Harness, Dickey & Pierce, P.L.C.

(57) ABSTRACT

An oscillator and a method of operating the same are provided, the oscillator may include a free layer, a pinned layer on a first surface of the free layer, and a reference layer on a second surface of the free layer. The free layer may have a variable magnetization direction. The pinned layer may have a pinned magnetization direction. The reference layer may have a magnetization direction non-parallel to the magnetization direction of the pinned layer.

18 Claims, 5 Drawing Sheets

(56) References Cited

U.S. PATENT DOCUMENTS

| | | | |
|---|---|---|---|
| 7,610,674 | B2 | 11/2009 | Zhang et al. |
| 7,616,412 | B2 | 11/2009 | Zhu et al. |
| 7,732,881 | B2 * | 6/2010 | Wang .......................... 257/421 |
| 7,764,538 | B2 | 7/2010 | Ito |
| 7,965,474 | B2 | 6/2011 | Sato et al. |
| 7,994,865 | B1 | 8/2011 | Manstretta et al. |
| 2002/0054461 | A1 | 5/2002 | Fujiwara et al. |
| 2004/0257717 | A1 | 12/2004 | Sharma et al. |
| 2005/0063222 | A1 | 3/2005 | Huai et al. |
| 2005/0254286 | A1 | 11/2005 | Valet |
| 2005/0254287 | A1 | 11/2005 | Valet |
| 2006/0256484 | A1 | 11/2006 | Sato et al. |
| 2007/0109147 | A1 | 5/2007 | Fukuzawa et al. |
| 2007/0188936 | A1 | 8/2007 | Zhang et al. |
| 2007/0259209 | A1 | 11/2007 | Slavin et al. |
| 2008/0019040 | A1 | 1/2008 | Zhu et al. |
| 2008/0074806 | A1 | 3/2008 | Sato et al. |
| 2008/0150640 | A1 | 6/2008 | Dimitrov et al. |
| 2008/0150643 | A1 | 6/2008 | Suzuki et al. |
| 2008/0241597 | A1 | 10/2008 | Dieny et al. |
| 2009/0080106 | A1 | 3/2009 | Shimizu et al. |
| 2009/0097169 | A1 | 4/2009 | Sato et al. |
| 2009/0097170 | A1 | 4/2009 | Sato et al. |
| 2009/0168501 | A1 | 7/2009 | Ito |
| 2009/0201614 | A1 | 8/2009 | Kudo et al. |
| 2009/0244792 | A1 | 10/2009 | Nakayama et al. |
| 2009/0302953 | A1 | 12/2009 | Xi et al. |
| 2009/0303779 | A1 | 12/2009 | Chen et al. |
| 2010/0039181 | A1 | 2/2010 | Firastrau et al. |
| 2010/0103730 | A1 | 4/2010 | Shin |
| 2010/0220415 | A1 * | 9/2010 | Yamada et al. ............... 360/319 |
| 2010/0308923 | A1 * | 12/2010 | Kaka ............................ 331/46 |
| 2012/0038428 | A1 | 2/2012 | Lee et al. |

FOREIGN PATENT DOCUMENTS

| | | |
|---|---|---|
| JP | 2008-053915 | 3/2008 |
| JP | 2008-084879 | 4/2008 |
| JP | 2009-094226 | 4/2009 |
| JP | 2009-099741 | 5/2009 |
| JP | 2009-135471 | 6/2009 |
| JP | 2009277704 A | 11/2009 |
| KR | 2004-0055384 | 6/2004 |
| KR | 10-0697779 | 3/2007 |
| KR | 10-0827497 | 4/2008 |
| KR | 10-0866973 | 11/2008 |
| KR | 2009-0011247 | 2/2009 |
| KR | 2009-0031819 | 3/2009 |
| KR | 2009-0044575 | 5/2009 |
| KR | 2009-0071404 | 7/2009 |
| KR | 2009-0087825 A | 8/2009 |
| KR | 2009-0102676 | 9/2009 |
| KR | 2009-0119253 A | 11/2009 |

OTHER PUBLICATIONS

Yoshida, et al.; "Unipolar resistive switching in CoFeB/MgO/CoFeB magnetic tunnel junction," *Applied Physics Letters*, vol. 92, pp. 113508-1-113508-3 (2008).

Houssameddine, et al.; "Spin transfer induced coherent microwave emission with large power from nanoscale MgO tunnel junctions," *Applied Physics Letters*, vol. 93, pp. 022505-1-022505-3 (2008).

Dimitrov, et al.; "Dielectric breakdown of MgO magnetic tunnel junctions," *Applied Physics Letters*, vol. 94, pp. 123110-1-113110-3 (Mar. 26, 2009).

Kiselev, et al.; "Microwave oscillations of a nanomagnet driven by a spin-polarized current," *Nature*, vol. 425, pp. 380-383 (Sep. 25, 2003).

Kaka, et al., "Mutual phase-locking of microwave spin torque nano-oscillators," *Nature*, vol. 427, pp. 389-392 (Sep. 15, 2005).

Deac, et al., "Bias-driven high-power microwave emission from MgO-based tunnel magnetoresistance devices," *Nature Physics*, vol. 4, pp. 803-809 (Aug. 10, 2008).

Georges, et al., "Origin of the spectral linewidth in nonlinear spin-transfer oscillators based on MgO tunnel junctions," *Physical Review*, vol. 80, pp. 060404-1-060404-4 (Aug. 31, 2009).

Rippard, et al., "Direct-Current Induced Dynamics in $Co_{90}Fe_{10}/Ni_{80}Fe_{20}$ Point Contacts," *Physical Review Letters*, vol. 92, No. 2, pp. 027201-1-027201-4 (Jan. 16, 2004).

Office Action dated Apr. 24, 2012 in co-pending U.S. Appl. No. 12/929,932.

Office Action dated Oct. 16, 2012 issued in related U.S. Appl. No. 13/064,627.

Office Action dated Aug. 22, 2012 issued in co-pending U.S. Appl. No. 13/099,684.

* cited by examiner

OSCILLATORS AND METHODS OF OPERATING THE SAME

CROSS-REFERENCE TO RELATED APPLICATIONS

This application claims the benefit of priority under 35 U.S.C. §119 from Korean Patent Application No. 10-2010-0086182, filed on Sep. 2, 2010, in the Korean Intellectual Property Office, the disclosure of which is incorporated herein by reference in its entirety.

BACKGROUND

1. Field

Example embodiments relate to oscillators and methods of operating the same.

2. Description of the Related Art

Oscillators are devices that generate signals having a regular cycle and are mainly used in wireless communication systems (e.g., mobile communication terminals, satellite/radar communication devices, wireless network devices, or automobile communication devices), as well as analog sound synthesizers. Mobile communication devices operate in specific frequency bands, and a voltage controlled oscillator (VCO) is used to generate a specific frequency band.

Essential characteristics of an oscillator include a quality factor, output power and phase noise. The higher the quality factor and output power and the lower the phase noise, the better the performance of the oscillator. Recently, because highly efficient and small communication devices are required and an operating frequency band has become high, small size and large output oscillators having a high quality factor and lower phase noise are required.

A spin torque oscillator using a spin transfer torque has been recently introduced. The spin torque oscillator may be classified as a nanopillar structure or a point contact structure. The spin torque oscillator has drawn attention as an advanced oscillator because the spin torque oscillator may be manufactured to be much smaller than general inductor and capacitor (LC) oscillators and general film bulk acoustic resonator (FBAR) oscillators. The spin torque oscillator may have a relatively high quality factor.

However, in a general spin torque oscillator, an angle of change of a magnetic moment (i.e., a spin) is small and thus the output power is low.

SUMMARY

Example embodiments relate to oscillators and methods of operating the same.

Provided are oscillators that use a spin transfer torque phenomenon and have a high output power. Provided are methods of operating the above oscillators.

Additional aspects will be set forth in part in the description which follows and, in part, will be apparent from the description, or may be learned by practice of the presented embodiments.

According to example embodiments, an oscillator includes a free layer having a variable magnetization direction, a pinned layer disposed on a first surface of the free layer and having a pinned magnetization direction, a reference layer disposed on a second surface of the free layer and having a magnetization direction non-parallel to the magnetization direction of the pinned layer, a first separation layer interposed between the free layer and the pinned layer, and a second separation layer interposed between the free layer and the reference layer.

Each of the free layer, the pinned layer and the reference layer may have in-plane magnetic anisotropy. The magnetization direction of the reference layer may be orthogonal to the magnetization direction of the pinned layer.

Each of the first and second separation layers may be an insulating layer or a conductive layer.

The first separation layer may have a lower resistance than the second separation layer. The first separation layer may be a conductive layer, and the second separation layer may be an insulating layer.

The pinned layer may be provided on a lower surface of the free layer, and the reference layer may be provided on an upper surface of the free layer.

The pinned layer may be a part of a synthetic anti-ferromagnetic (SAF) structure.

The oscillator may further include an anti-ferromagnetic layer disposed on a surface of the pinned layer and configured to pin the magnetization direction of the pinned layer.

The reference layer may have a greater width than the free layer in a direction parallel to the magnetization direction of the reference layer.

A plurality of free layers may be provided on a surface of the reference layer, and a plurality of pinned layers may be provided to correspond to the plurality of free layers.

According to example embodiments, a method of operating an oscillator is provided. The oscillator includes a free layer having a variable magnetization direction, a pinned layer disposed on a first surface of the free layer and having a pinned magnetization direction, a reference layer disposed on a second surface of the free layer and having a magnetization direction non-parallel to the magnetization direction of the pinned layer, a first separation layer interposed between the free layer and the pinned layer, and a second separation layer interposed between the free layer and the reference layer. The method of operating the oscillator includes applying a current to the oscillator, and detecting a resistance variation of the oscillator.

The current may be applied to the oscillator so that electrons flow from the pinned layer through the free layer to the reference layer.

Each of the pinned layer, the free layer and the reference layer may have in-plane magnetic anisotropy.

The magnetization direction of the reference layer may be orthogonal to the magnetization direction of the pinned layer.

Each of the first and second separation layers may be an insulating layer or a conductive layer.

The first separation layer may have a lower resistance than the second separation layer.

The first separation layer may be a conductive layer, and the second separation layer may be an insulating layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
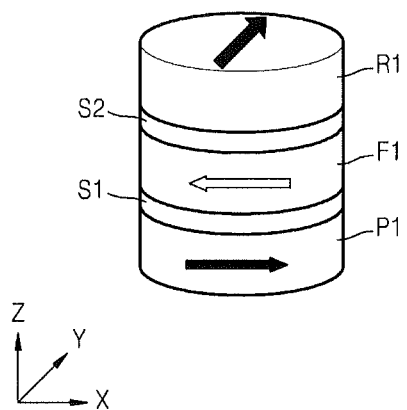
FIGS. 1 through 3 are perspective views of oscillators according to example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

Example embodiments relate to oscillators and methods of operating the same.

FIG. 1 is a perspective view of an oscillator according to example embodiments.

Referring to FIG. 1, a pinned layer P1 may be provided on a first surface (e.g., lower surface) of a free layer F1. A reference layer R1 may be provided on a second surface (e.g., upper surface) of the free layer F1. The pinned layer P1 and the reference layer R1 may be provided on opposing surfaces of the free layer F1. The reference layer R1 may have a magnetization direction non-parallel to a magnetization direction of the pinned layer P1. A first separation layer S1 may be provided between the free layer F1 and the pinned layer P1, and a second separation layer S2 may be provided between the free layer F1 and the reference layer R1. Hereinafter, the above-described components will be described in more detail.

The free layer F1 may be a layer of which magnetization direction is variable. The free layer F1 may be formed of a general ferroelectric material. The ferroelectric material may contain at least one selected from the group consisting of cobalt (Co), iron (Fe), nickel (Ni) and combinations thereof, and may further contain other elements (e.g., boron (B), chromium (Cr), platinum (Pt), palladium (Pd) or combinations thereof).

The pinned layer P1 may be a layer of which magnetization direction is fixed to a set direction. For example, the pinned layer P1 may be formed of a ferroelectric material containing at least one selected from the group consisting of Co, Fe, Ni and combinations thereof. The ferroelectric material may further contain other elements (e.g., B, Cr, Pt, Pd or combinations thereof) than Co, Fe, and Ni. The magnetization direction of the pinned layer P1 may be pinned using various methods. For example, the magnetization direction of the pinned layer P1 may be pinned using a synthetic anti-ferromagnetic (SAF) structure (not shown) or an anti-ferromagnetic layer (not shown), which will be described in detail later with reference to FIGS. 2 and 3. Even if the SAF structure or the anti-ferromagnetic layer is not used, the magnetization direction of the pinned layer P1 may be fixed to a set direction by increasing the thickness of the pinned layer P1 or by use of shape anisotropy. That is, the magnetization direction of the pinned layer P1 may be pinned without the aid of an additional layer.

The reference layer R1 may be a layer of which magnetization direction is pinned like the pinned layer P1. That is, the reference layer R1 may be a kind of pinned layer. Thus, the reference layer R1 may be formed of a ferroelectric material, similar to the pinned layer P1. The magnetization direction of the reference layer R1 may be non-parallel to the magnetization direction of the pinned layer P1. For example, the magnetization direction of the reference layer R1 may be orthogonal in an XY plane to the magnetization direction of the pinned layer P1. By use of the reference layer R1 having a magnetization direction non-parallel (e.g., orthogonal) to the magnetization direction of the pinned layer P1 as described above, the output power of the oscillator may be increased, which will be described in detail later. A method of pinning the magnetization direction of the reference layer R1 may be similar to a method of pinning the magnetization direction of the pinned layer P1. A pinning element (e.g., the SAF structure or anti-ferromagnetic layer) configured to pin the magnetization direction of the reference layer R1 may be provided on the reference layer R1. The magnetization direction of the reference layer R1 may be pinned by increasing the thickness of the reference layer R1 or by use of shape anisotropy without using the pinning element.

All of the free layer F1, the pinned layer P1 and the reference layer R1 may have in-plane magnetic anisotropy. In this case, as shown in FIG. 1, the magnetization direction of the pinned layer P1 may be pinned in an X-axis direction, and the free layer F1 may have a magnetization easy axis parallel to an X-axis. The magnetization direction of the reference layer R1 may be in a Y-axis direction, for example. The magnetization directions shown in FIG. 1 are an example. That is, the magnetization directions of the pinned layer P1 and the reference layer R1 and a direction of the magnetization easy axis of the free layer F2 are not limited to directions shown in FIG. 1 but may be variously changed. For instance, the magnetization directions of the reference layer R1 and the pinned layer P1 may not be orthogonal to each other but form an acute angle θ1 between 0° and 90° (0°<θ1<90°) or an obtuse angle θ2 between 90° and 180° (90°<θ2<180°).

Each of the first and second separation layers S1 and S2 may be an insulating layer or a conductive layer. The insulating layer may include, for example, an oxide (e.g., magnesium (Mg) oxide or aluminum (Al) oxide). The conductive layer may include, for example, at least one metal selected from the group consisting of copper (Cu), aluminum (Al), gold (Au), silver (Ag), ruthenium (Ru) and a mixture thereof.

When the first and second separation layers S1 and S2 are insulating layers, the oscillator according to example embodiments may have a tunnel magneto resistance (TMR) structure. When the first and second separation layers S1 and S2 are conductive layers, the oscillator according to example embodiments may have a giant magneto resistance (GMR) structure. If necessary, one of the first and second separation layers S1 and S2 may be an insulating layer, and the other one thereof may be a conductive layer.

Each of the first and second separation layers S1 and S2 may have a thickness of, for example, about 0.5 to 3 nm. The first separation layer S1 may have a lower resistance than the second separation layer S2. When the first separation layer S1 has a lower resistance than the second separation layer S2, a magnetoresistance (MR) element (hereinafter "first MR element") including the pinned layer P1, the first separation layer S1 and the free layer F1 may have a lower resistance than an MR element (hereinafter "second MR element") including the free layer F1, the second separation layer S2 and the reference layer R1. Accordingly, a variation in the resistance of the entire oscillator may depend on the second MR element rather than the first MR element. In this case, increasing the output power of the oscillator may be further facilitated, as will be described in detail later. The first separation layer S1 may be formed using a conductive layer (e.g., a metal layer), and the second separation layer S2 may be formed using an insulating layer so that the first separation layer S1 has a lower resistance than the second separation layer S2. However, even if both the first and second separation layers S1 and S2 are formed using an insulating layer (or conductive layer), the first separation layer S1 may be formed to have a lower resistance than the second separation layer S2. That is, the first separation layer S1 may be formed using an insulating layer (or conductive layer) having a relatively low resistance, while the second separation layer S2 may be formed using an insulating layer (or conductive layer) having a relatively high resistance.

Although not shown in FIG. 1, a first electrode may be provided on a bottom (or lower) surface of the pinned layer P1, and a second electrode may be provided on a top (or upper) surface of the reference layer R1. The first and second electrodes may be optionally provided according to materials of the pinned layer P1 and the reference layer R1. For example, when the pinned layer P1 and the reference layer R1 have sufficiently low electrical resistances, the first and second electrodes may not be provided because the pinned layer P1 and the reference layer R1 may be used as electrodes by themselves.

The above-described oscillator according to example embodiments may generate signals in specific frequency bands using the precession of a magnetic moment of the free layer F1. The precession of the magnetic moment means that an axis of the magnetic moment rotates in a specific orbit. Here, an axial direction of the magnetic moment may be regarded the same as a magnetization direction. Accordingly, the precession of the magnetic moment may correspond to rotation of the magnetization direction. Due to the precession of the magnetic moment of the free layer F1, an electric resistance between the reference layer R1 and the free layer F1 may periodically vary. As a result, signals may be generated in specific frequency bands.

Figure 2:
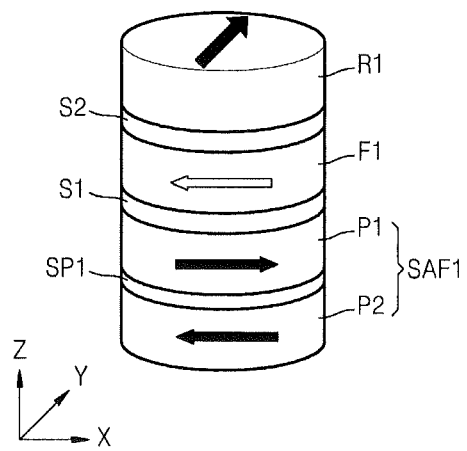
Figure 3:
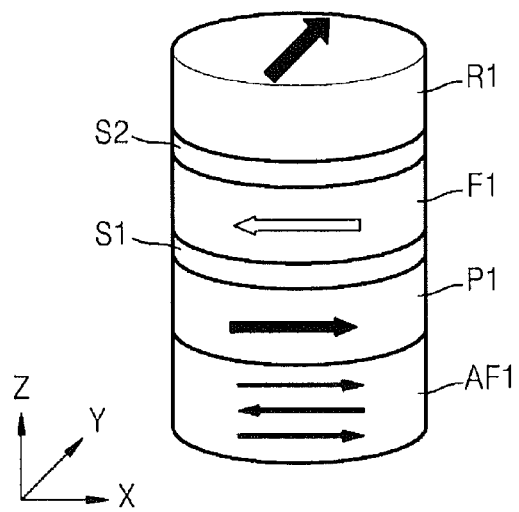

FIGS. 2 and 3 are perspective views of oscillators according to example embodiments.

FIG. 2 shows a case where a pinned layer P1 is a part of an SAF structure SAF1, and FIG. 3 shows a case where an anti-ferromagnetic layer AF1 is provided on a bottom (or lower) surface of a pinned layer P1. The SAF structure SAF1 and the anti-ferromagnetic layer AF1 may be elements for fixing the magnetization direction of the pinned layer P1.

Referring to FIG. 2, a spacer SP1 and a second pinned layer P2 may be sequentially provided on a bottom (or lower)

surface of the pinned layer P1 (hereinafter "first pinned layer"). The first and second pinned layers P1 and P2 may have magnetization directions pinned in opposite directions. In other words, the first pinned layer P1 and the second pinned layer P2 may be magnetized in opposite directions. The first and second pinned layers P1 and P2 may have magnetization directions pinned in opposite directions due to exchange coupling characteristics between the two pinned layers P1 and P2. The exchange coupling characteristics may be obtained when a material and a thickness of the spacer SP1 satisfy set conditions. In this case, the first and second pinned layers P1 and P2 may be regarded to form the SAF structure SAF1 having the spacer SP1 interposed therebetween. Although not shown, an anti-ferromagnetic layer may be further provided on a bottom (or lower) surface of the second pinned layer P2 to pin the magnetization direction of the second pinned layer P2.

Referring to FIG. 3, an anti-ferromagnetic layer AF1 may be provided on a bottom (or lower) surface of the pinned layer P1. The anti-ferromagnetic layer AF1 may have characteristics in which magnetic moments of atoms are regularly arranged in a positive direction and a reverse direction. The magnetization direction of the pinned layer P1 may be pinned in the same direction as an uppermost magnetic moment of the anti-ferromagnetic layer AF1 that is adjacent to the pinned layer P1. As shown in FIG. 3, when the uppermost magnetic moment of the anti-ferromagnetic layer AF1 is in an X-axis direction, the magnetization of the pinned layer P1 may be pinned in the X-axis direction. The anti-ferromagnetic layer AF1 may include, for example, a manganese (Mn)-based material. The Mn-based material may be platinum-manganese (PtMn), indium-manganese (InMn) or iron manganese (FeMn). However, the anti-ferromagnetic layer AF1 is not limited to the Mn-based material. The anti-ferromagnetic layer AF1 may be formed of any material having anti-ferromagnetic characteristics.

Figure 4:
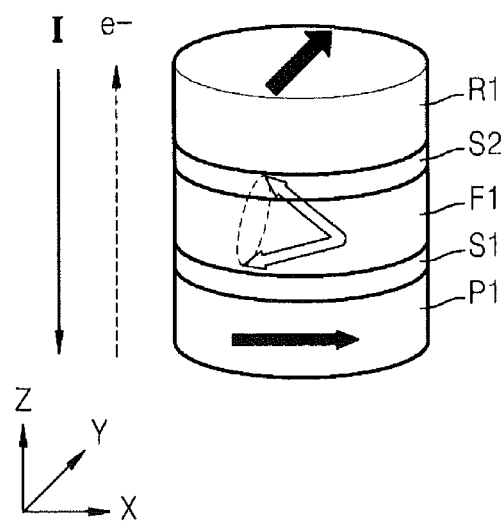
FIG. 4 is a perspective view illustrating a method of operating the oscillator of FIG. 1.

FIG. 4 is a perspective view illustrating a method of operating the oscillator of FIG. 1.

Referring to FIG. 4, by applying current, I, to the oscillator, the magnetic moment of the free layer F1 may be precessed. The current I may be applied from the reference layer R1 through the free layer F1 to the pinned layer P1. Due to the current I, electrons (e-) may flow from the pinned layer P1 through the free layer F1 to the reference layer R1. The electrons (e-) flowing to the free layer F1 through the pinned layer P1 may have the same spin direction as the pinned layer P1 and apply a spin torque to the free layer F1. The magnetic moment of the free layer F1 may be perturbed due to the spin torque. Also, a stray field may be applied from the pinned layer P1 to the free layer F1. Due to the stray field, a restoring force may be applied to the magnetic moment of the free layer F1. Therefore, the perturbing force of the magnetic moment of the free layer F1 due to the spin torque and the restoring force of the magnetic moment of the free layer F1 due to the stray field may be balanced so that the magnetic moment may be precessed. Due to the precession of the magnetic moment, the electric resistance of the oscillator may be periodically changed, thus resulting in oscillation of signals in specific frequency bands. The above-described mechanism of the precession of the magnetic moment is only an example, and thus other principles may be further applied thereto. Also, a path of precession shown in FIG. 4 is only an example, and the orbit and direction of precession may be varied according to the intensity of current I, for example.

Figure 5:
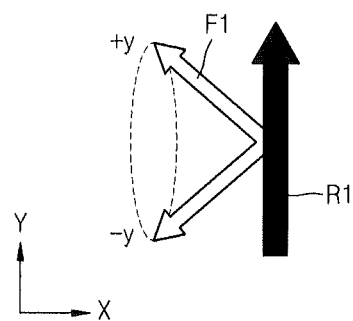
FIG. 5 is a diagram showing examples of a magnetization direction of a reference layer and precession of a magnetic moment of a free layer during operation of the oscillator of FIG. 1.

FIG. 5 is a diagram showing examples of the magnetization direction of the reference layer R1 and precession of the magnetic moment of the free layer F1 during operation of the oscillator of FIG. 1.

Referring to FIG. 5, because the magnetic moment of the free layer F1 reciprocates between a +y region and a −y region, the magnetic moment of the free layer F1 and the magnetization direction of the reference layer R1 may make a semi-parallel state and a semi-antiparallel state alternately and repeatedly. In other words, the semi-parallel state where the magnetic moment of the free layer F1 and the magnetization direction of the reference layer R1 are present in the +y region, and the semi-antiparallel state where the magnetic moment of the free layer F1 is in the −y region, while the magnetization direction of the reference layer R1 is in the +y region, may be periodically repeated. The oscillator may have the lowest resistance in the semi-parallel state, and have the highest resistance in the semi-antiparallel state. Therefore, the oscillator according to example embodiments may exhibit a high output power.

Figure 6:
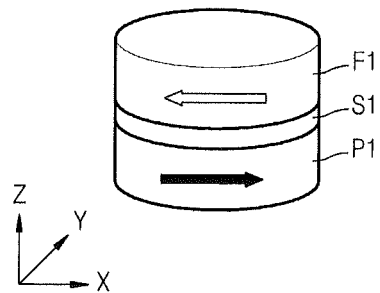
FIG. 6 is a perspective view of an oscillator according to a comparative example.

FIG. 6 is a perspective view of an oscillator according to a comparative example compared with example embodiments.

Referring to FIG. 6, the oscillator according to the comparative example may include a pinned layer P1, a free layer F1 and a first separation layer S1 interposed therebetween. That is, the oscillator according to the comparative example has the same structure as the oscillator of FIG. 1, except that the reference layer R1 and the second separation layer S2 are omitted. The oscillator according to the comparative example may be a general oscillator.

Figure 7:
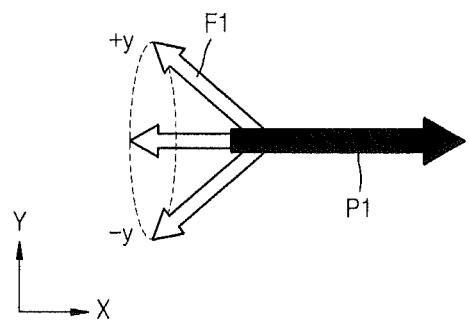
FIG. 7 is a diagram showing a magnetization direction of a pinned layer and precession of a magnetic moment of a free layer during operation of the oscillator of FIG. 6.

FIG. 7 is a diagram showing a magnetization direction of the pinned layer P1 and precession of a magnetic moment of the free layer F1 during operation of the oscillator of FIG. 6.

Referring to FIG. 7, although the magnetic moment of the free layer F1 reciprocates between a +y region and a −y region, because the magnetization direction of the pinned layer P1 is parallel to an X-axis, the magnetic moment of the free layer F1 and the magnetization direction of the pinned layer P1 may be obtained by alternately repeating an antiparallel state and a semi-antiparallel state. When the magnetic moment of the free layer F1 and the magnetization direction of the pinned layer P1 are in an antiparallel state (i.e., when the magnetic moment of the free layer F1 is in a reverse direction to the x-axis), the oscillator may have the highest resistance. When the magnetic moment of the free layer F1 moves to the +y region or the −y region, the oscillator may have the lowest resistance because the magnetic moment of the free layer F1 and the magnetization direction of the pinned layer P1 enter into the semi-antiparallel state. Because the oscillator according to the comparative example may oscillate signals due to the repetition of the antiparallel state and the semi-antiparallel state, the oscillator according to the comparative example may oscillate signals with substantially lower powers as compared with the oscillator of example embodiments, which may alternately repeat the semi-parallel state and the semi-antiparallel state. In other words, the oscillator according to example embodiments may repeat the semi-parallel state and the semi-antiparallel state by use of the reference layer R1 having a magnetization direction non-parallel (e.g., orthogonal) to the pinned layer P1. As a result, the oscillator according to example embodiments may exhibit a high output power.

In addition, during operation of the oscillator according to example embodiments, a resistance variation may occur between the pinned layer P1 and the free layer F1 due to the precession of the magnetic moment of the free layer F1 The resistance variation between the pinned layer P1 and the free layer F1 may be similar to a resistance variation between the pinned layer P1 and the free layer F1, as shown in FIG. 7. In the oscillator according to example embodiments, a resistance variation in the entire oscillator may not be greatly affected by the resistance variation between the pinned layer P1 and the free layer F1 because the resistance variation between the pinned layer P1 and the free layer F1 is substantially smaller than the resistance variation between the free layer F1 and the reference layer R1. In particular, when the first separation layer S1 has a lower resistance than the second separation layer S2, a resistance level between the pinned layer P1 and the free layer F1 (i.e., a resistance level of a first MR element comprised of the pinned layer P1, the first separation layer S1 and the free layer F1) may be much lower than a resistance level between the free layer F1 and the reference layer R1 (i.e., a resistance level of a second MR element comprised of the free layer F1, the second separation layer S2 and the reference layer R1). Therefore, the resistance variation of the entire oscillator may be dominantly affected by the resistance variation between the free layer F1 and the reference layer R1, namely, the resistance variation of the second MR element.

Figure 8:
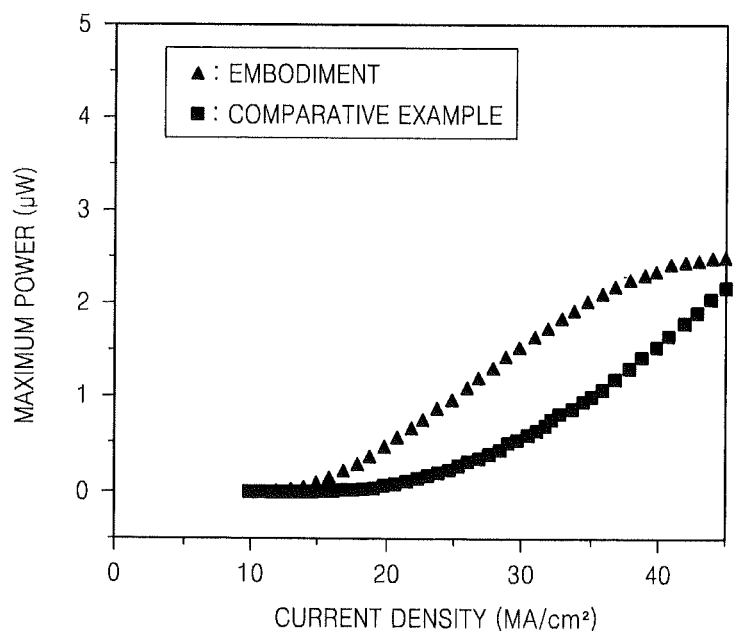
FIG. 8 is a graph of maximum power relative to current density in example embodiments and a comparative example.

FIG. 8 is a graph of maximum power relative to the current density in an oscillator according to example embodiments and a comparative example. Here, the oscillator according to example embodiments has the structure of FIG. 2. In this case, the first separation layer S1 has a resistance of about 1 $\Omega\mu m^2$, and the second separation layer S2 has a resistance of about 10 $\Omega\mu m^2$. Also, the oscillator according to the comparative example has the same structure as shown FIG. 2 except that the reference layer R1 and the second separation layer S2 are removed. In this case, the first separation layer S1 has a resistance of about 10 $\Omega\mu m^2$.

Referring to FIG. 8, it can be confirmed that the oscillator according to example embodiments exhibits a substantially higher maximum power than the oscillator according to the comparative example within the range of measured current densities (i.e., at a current density of about 10 to 45 $MA/cm^2$). As such, according to example embodiments, a spin torque oscillator capable of exhibiting a high output power even at a low current density may be embodied.

Figure 9:
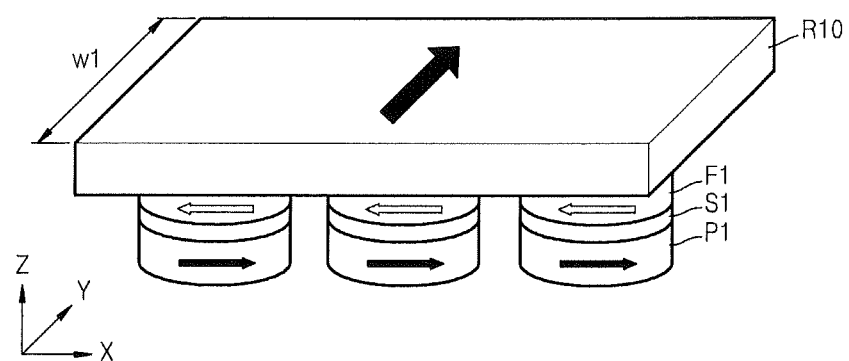
FIG. 9 is a perspective view of an oscillator according to example embodiments.

FIG. 9 is a perspective view of an oscillator according to other example embodiments.

Referring to FIG. 9, a common reference layer R10 may be prepared. A plurality of free layers F1 may be provided on a surface (e.g., a lower surface) of the common reference layer R10. A pinned layer P1 may be provided on a lower surface of each of the plurality of free layers F1. The common reference layer R10, the free layer F1 and the pinned layer P1 may have the same magnetic characteristics as the reference layer R1, the free layer F1 and the pinned layer P1 of FIG. 1, respectively. The plurality of pinned layers P1 may be electrically connected to one another and synchronized. As such, if signals are generated from the plurality of free layers F1 by connecting the plurality of free layers F1 and pinned layers P1 to the common reference layer R10 in common, the output power of the oscillator may be further increased.

Furthermore, in example embodiments, a width w1 of the common reference layer R10 measured in a Y-axis direction may be greater than the width (i.e., diameter) of the free layer F1. That is, the common reference layer R10 may have a width w1 greater than that of the free layer F1 in a direction parallel to the magnetization direction of the common reference layer R10. In this case, because magnetic poles (N and S poles) of the common reference layer R10 are farther from the free layer F1, the magnetic influence of the common reference layer R10 on the free layer F1 may be suppressed or prevented. Accordingly, the magnetic moment of the free layer F1 may be precessed without the magnetic influence of the common reference layer R10. Similar to the structure of FIG. 9, each of the oscillators shown in FIGS. 1 through 3 may be configured such that the widths (diameters) of the reference layer R1 measured in the Y-axis direction is greater than that of the free layer F1. However, even if the free layer F1 is somewhat under the magnetic influence of the reference layer R1 or common reference layer R10, the magnetic moment of the free layer F1 may be precessed, thus allowing the oscillator to normally operate.

Figure 10:
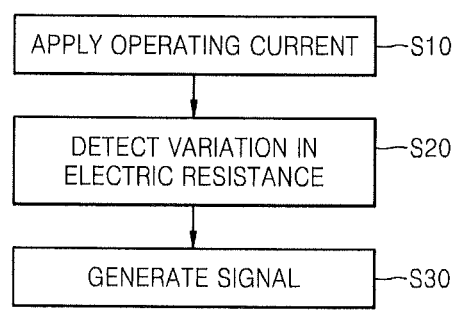
FIG. 10 is a flowchart illustrating a method of operating an oscillator according to example embodiments.

FIG. 10 is a flowchart illustrating a method of operating an oscillator according to example embodiments. The flowchart of FIG. 10 will be briefly described in association with FIG. 4.

Referring to FIG. 10, a magnetic moment of a free layer F1 may be precessed by applying current to the oscillator (S10). During the precession of the magnetic moment of the free layer F1, a variation in electric resistance of the oscillator may be detected (S20). The electric resistance of the oscillator may periodically vary due to the precession. Due to the variation in the electric resistance of the oscillator, a signal having a set frequency may be generated (S30).

The oscillator according to example embodiments may be a frequency tunable oscillator of which a frequency varies according to an operating current (i.e., the current I of FIG. 4). Also, an oscillation frequency of the oscillator according to example embodiments may be controlled according to the thicknesses and materials of layers constituting the oscillator.

Furthermore, when conversely applying the above-described principles of the oscillator, a radio-frequency (RF) detector configured to convert an RF signal into a direct-current (DC) signal may be embodied. In other words, each of the structures described with reference to FIGS. 1 through 3 and 9 may be applied to an RF detector instead of an oscillator. Because those skilled in the art know that an RF detector may be embodied by conversely applying the principles of the oscillator, a detailed description of the RF detector will be omitted.

While the present invention has been particularly shown and described with reference to example embodiments thereof, it will be understood by those of ordinary skill in the art that various changes in form and details may be made therein without departing from the spirit and scope of the present invention as defined by the following claims. It would be apparent to those skilled in the art that not only the structures of the oscillators shown in FIGS. 1 through 3 and 9, but also methods of operating the oscillators may be variously changed. For example, another material layer may be further provided between layers constituting the oscillators or on at least one of top (upper) and bottom (lower) surfaces of the oscillators. It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. An oscillator, comprising:
   a free layer having a variable magnetization direction;
   a pinned layer on a first surface of the free layer and having a pinned magnetization direction; and
   a reference layer on a second surface of the free layer and having a magnetization direction which is non-parallel and non-antiparallel to the magnetization direction of the pinned layer,
   wherein each of the free layer, the pinned layer and the reference layer has in-plane magnetic anisotropy.

2. The oscillator of claim 1, wherein the magnetization direction of the reference layer is orthogonal to the magnetization direction of the pinned layer.

3. The oscillator of claim 1, further comprising:
a first separation layer interposed between the free layer and the pinned layer; and
a second separation layer interposed between the free layer and the reference layer,
wherein each of the first and second separation layers is an insulating layer or a conductive layer.

4. The oscillator of claim 1, further comprising:
a first separation layer interposed between the free layer and the pinned layer; and
a second separation layer interposed between the free layer and the reference layer,
wherein the first separation layer has a lower resistance than the second separation layer.

5. The oscillator of claim 1, further comprising:
a first separation layer interposed between the free layer and the pinned layer; and
a second separation layer interposed between the free layer and the reference layer,
wherein the first separation layer is a conductive layer, and the second separation layer is an insulating layer.

6. The oscillator of claim 1, wherein the pinned layer is provided on a lower surface of the free layer, and the reference layer is provided on an upper surface of the free layer.

7. The oscillator of claim 1, wherein the pinned layer is a part of a synthetic anti-ferromagnetic (SAF) structure.

8. The oscillator of claim 1, further comprising an anti-ferromagnetic layer on a surface of the pinned layer and configured to pin the magnetization direction of the pinned layer.

9. The oscillator of claim 1, wherein the reference layer has a greater width than the free layer in a direction parallel to the magnetization direction of the reference layer.

10. The oscillator of claim 1, further comprising a plurality of free layers on a surface of the reference layer; and
a plurality of pinned layers each corresponding to one of the plurality of free layers.

11. The oscillator of claim 10, wherein the plurality of free layers are laterally separated from each other on the surface of the reference layer.

12. A method of operating an oscillator, the method comprising:
applying a current to the oscillator, wherein the oscillator includes,
a free layer having a variable magnetization direction,
a pinned layer on a first surface of the free layer and having a pinned magnetization direction, and
a reference layer on a second surface of the free layer and having a magnetization direction which is non-parallel and non-antiparallel to the magnetization direction of the pinned layer, wherein each of the free layer, the pinned layer and the reference layer has in-plane magnetic anisotropy; and
detecting a resistance variation of the oscillator.

13. The method of claim 12, wherein the current is applied to the oscillator so that electrons flow from the pinned layer through the free layer to the reference layer.

14. The method of claim 12, wherein the magnetization direction of the reference layer is orthogonal to the magnetization direction of the pinned layer.

15. The method of claim 12, wherein the oscillator further includes a first separation layer interposed between the free layer and the pinned layer, and a second separation layer interposed between the free layer and the reference layer, and
each of the first and second separation layers is an insulating layer or a conductive layer.

16. The method of claim 12, wherein the oscillator further includes a first separation layer interposed between the free layer and the pinned layer, and a second separation layer interposed between the free layer and the reference layer, and
the first separation layer has a lower resistance than the second separation layer.

17. The method of claim 12, wherein the oscillator further includes a first separation layer interposed between the free layer and the pinned layer, and a second separation layer interposed between the free layer and the reference layer, and
the first separation layer is a conductive layer, and the second separation layer is an insulating layer.

18. An oscillator, comprising:
a free layer having a variable magnetization direction;
a pinned layer on a first surface of the free layer and having a pinned magnetization direction; and
a reference layer on a second surface of the free layer and having a magnetization direction non-parallel to the magnetization direction of the pinned layer,
wherein the reference layer has a greater width than the free layer in a direction parallel to the magnetization direction of the reference layer, and
wherein the reference layer has a greater width than the free layer in an in-plane direction of the reference layer.

* * * * *